(12) United States Patent
Lercel et al.

(10) Patent No.: US 6,461,797 B1
(45) Date of Patent: Oct. 8, 2002

(54) METHOD AND APPARATUS FOR SELECTIVELY PROGRAMMING A SEMICONDUCTOR DEVICE

(75) Inventors: Michael J. Lercel, Williston; Jed H. Rankin, Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,938

(22) Filed: Nov. 19, 1999

(51) Int. Cl.⁷ .................................................. G03C 5/56
(52) U.S. Cl. ...................... 430/318; 430/313; 430/311; 430/322; 216/41; 250/370.01
(58) Field of Search ................................ 430/313, 318, 430/322, 311; 216/41; 250/370.01

(56) References Cited

U.S. PATENT DOCUMENTS

| | | | |
|---|---|---|---|
| 4,184,909 A | * 1/1980 | Chang et al. | 156/643 |
| 4,661,679 A | 4/1987 | Pardee | 219/121 L |
| 4,793,699 A | 12/1988 | Tokuhara | 350/487 |
| 5,045,419 A | 9/1991 | Okumura | 430/20 |
| 5,082,755 A | 1/1992 | Liu | 430/5 |
| 5,229,872 A | 7/1993 | Mumola | 359/40 |
| 5,523,193 A | * 6/1996 | Nelson | 430/311 |
| 5,691,541 A | 11/1997 | Ceglio et al. | 250/492.1 |
| 5,760,674 A | 6/1998 | Gilmour et al. | 337/297 |
| 5,870,176 A | 2/1999 | Sweatt et al. | 355/53 |
| 6,194,318 B1 | * 2/2001 | Ikeda | 438/699 |
| 6,291,110 B1 | * 9/2001 | Cooper et al. | 430/5 |

* cited by examiner

*Primary Examiner*—John A. McPherson
*Assistant Examiner*—Daborah Chacko-Davis
(74) *Attorney, Agent, or Firm*—Richard A. Henkler

(57) ABSTRACT

A method of programming a conductive semiconductor device having a plurality of conductive links by selective removal of all or portions of the conductive link using photolithographic and subtractive etching. Removal of only pre-selected conductive links is accomplished by use of a programmable array shutter to expose photoresist only above the conductive links to be removed.

6 Claims, 7 Drawing Sheets

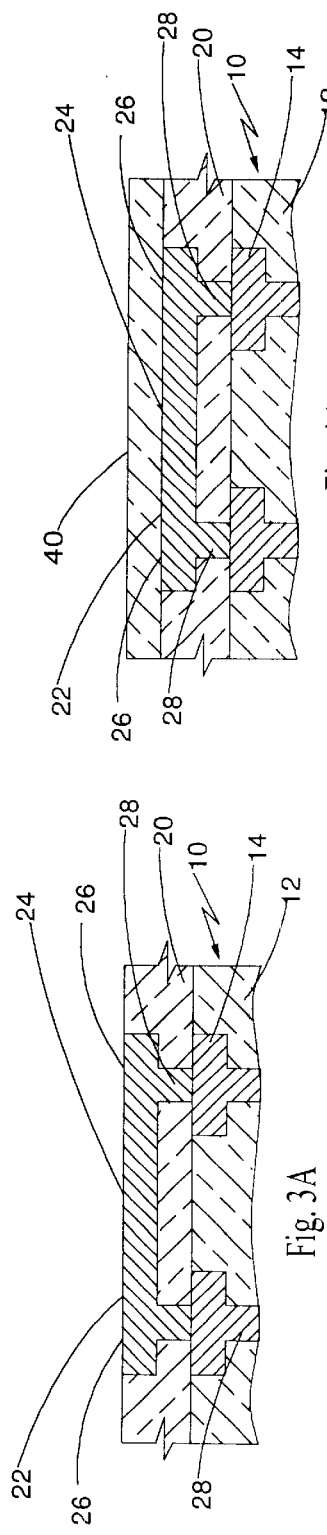
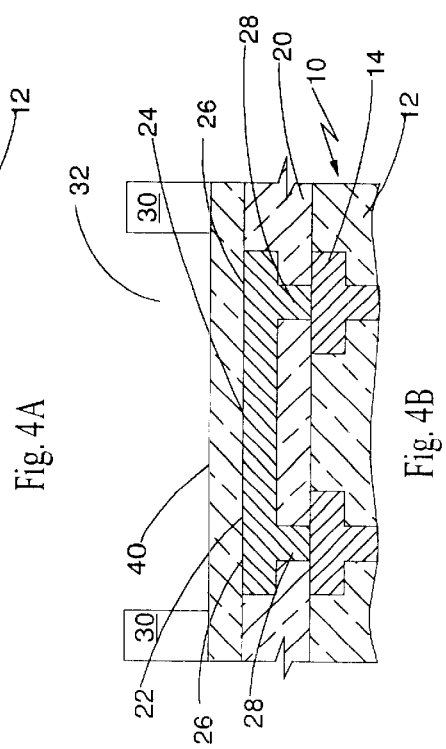
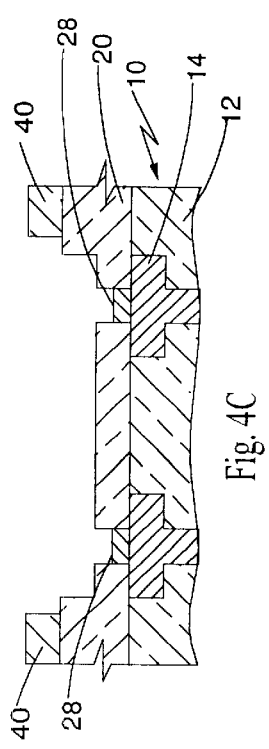
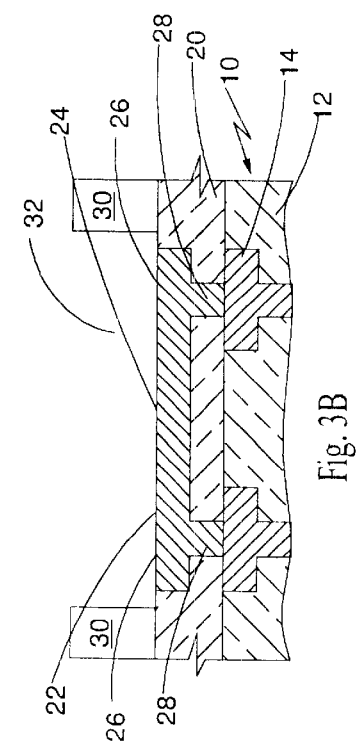
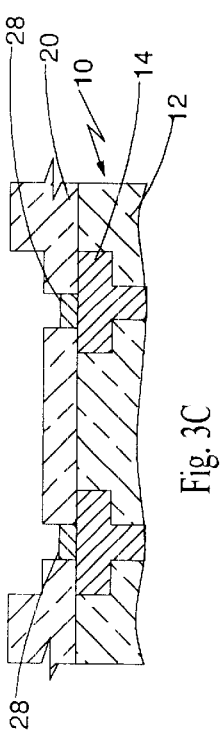
Fig. 3A
Fig. 3B
Fig. 3C
Fig. 4A
Fig. 4B
Fig. 4C

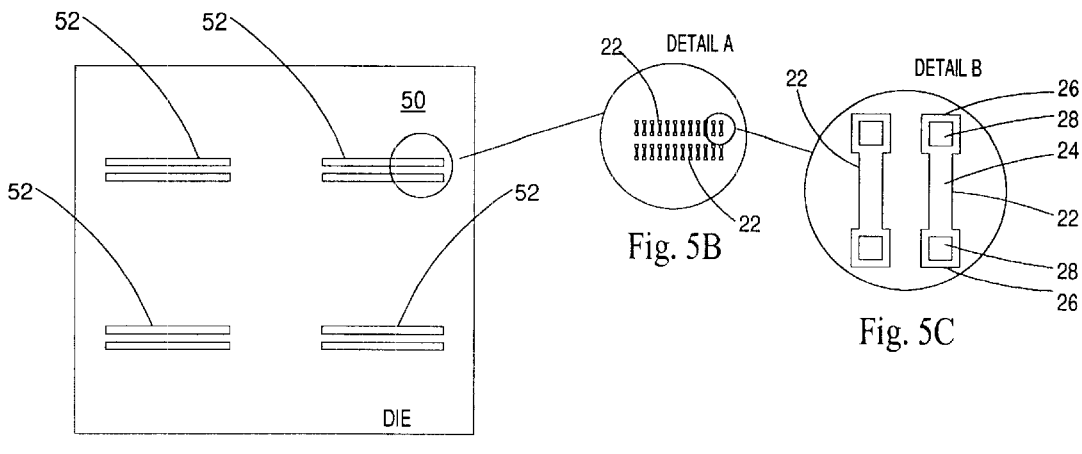
Fig. 5A  Fig. 5B  Fig. 5C
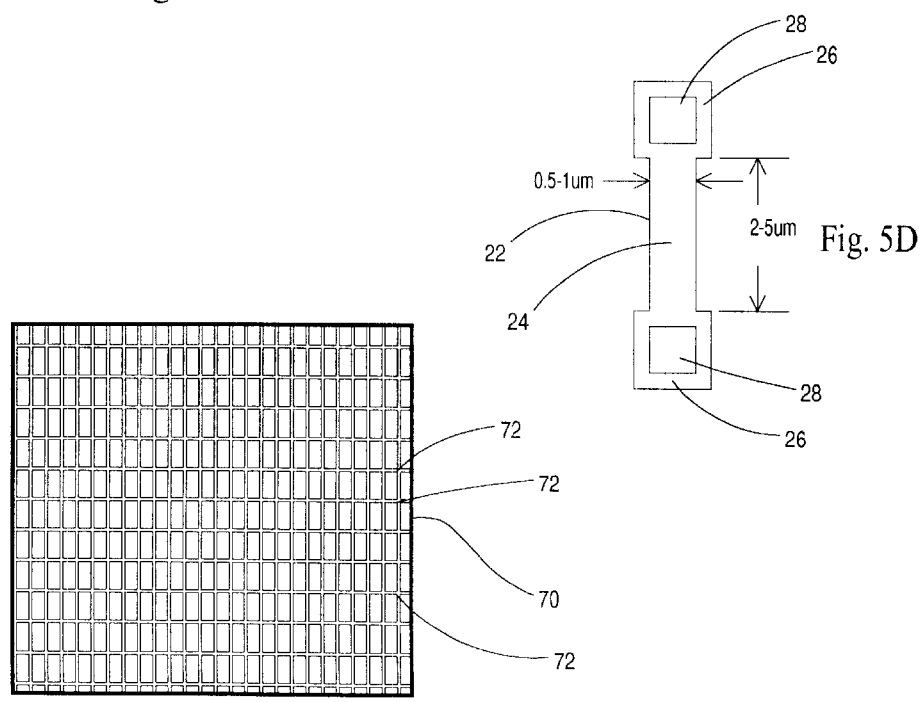
Fig. 5D
Fig. 6

METHOD AND APPARATUS FOR SELECTIVELY PROGRAMMING A SEMICONDUCTOR DEVICE

FIELD OF THE PRESENT INVENTION

The present invention generally relates to the field of programming semiconductor, and more specifically, to a method and an apparatus for selectively programming a semiconductor device via the removal of conductive links (fuses).

BACKGROUND OF THE INVENTION

The use of fusible links for redundancy programming of semiconductor devices (e.g. DRAMs. and SKAM's, and embedded arrays in various logic dies) is a well known technique. Fusible links are also used to create electronic identification and serial numbers on dies. and to program dies for different functions, or to trim devices for ranges of operation. The most common method of blowing (removing) these links is by laser oblation. One example of such a fusible link for laser oblation is described in U.S. Pat. No. 5,760,674 to Gilmour et al.

A reason for the popularity of fuse blowing techniques, is that the techniques are readily applicable to devices, single dies, and wafers full of dies. Further, the current techniques also provide the ability to uniquely program each die. The use of laser fuse blow techniques also allows the fast selection of the fuses to be blown from among the numerous fuses residing in a set on a single die. Typical laser fuse blow techniques are driven by computer in order to allow individual fuse blow patterns on each die of a wafer.

There are problems, however, with the laser blow technique when the metallurgy of the device or fusible link is copper and/or the dielectric isolation is a porous material of the class of materials known as low dielectric constant dielectrics. or low k dielectrics. Copper is typically used to lower the resistance of signal lines, while low k dielectrics are often used to reduce the capacitive coupling between signal lines. Both of these effects are desirable, since they improve overall device performance.

Lasers blow fuses by heating up the link to the point where it boils and literally ejects material under high pressure. Traditionally, the metal of the fuse has been aluminum. If copper is used as the fuse material, the higher laser power is required, increasing the risk of damage to the dielectric isolation. Other effects of laser oblation of fuses on devices using low k dielectrics are: 1) the porous cell structure low k dielectric will collapse and electrically degrade the chip performance and, 2) injection into and subsequent migration within the porous low k dielectric of metal atoms expelled from the link during fuse blow.

It would be, therefore, a distinct advantage to have a technique for blowing fuses residing on low k dielectrics that would allow fast selection of the fuses to be blown, and unique programming of fuse blows for a set on a die. The present invention provides such a method and apparatus.

SUMMARY OF THE INVENTION

The present invention provides a method of programming a semiconductor device using photolithographic means by forming a layer of photoresist over an array of conductive links; removing a pre-selected portion of the photoresist from a subset of said array of conductive links; and removing the thus exposed conductive links.

The present invention further provides a method of programming a semiconductor wafer having dies with each die having arrays of conductive links, comprising the steps of:

(a) forming a layer of photoresist on the wafer;
(b) aligning and opening a pre-selected portion of shutters in the shutter array corresponding to a programming pattern;
(c) exposing the photoresist to activating illumination through the shutter array;
(d) repeating steps b–d for each of the remaining dies on said wafer; and
(e) developing the photoresist layer and removing unprotected conductive links.

The present invention also provides a system for programming semiconductor dies on a wafer coated with photoresist, each die having an array of conductive links, comprising:

testing each die on the wafer to determine which conductive links to remove;

creating a wafer test data set based on an electrical location of each conductive link to be removed;

converting said electrical location of each conductive link to be removed in the wafer test data set to a physical location of each conductive link to be removed that is stored in a link removal data set; and converting the link removal data set to shutter and stage control data sets suitable for use by a lithographic exposure system having an array shutter system and a stage alignment system, wherein the lithographic exposure system uses the stage control data set to align each die to said array shutter system and uses the shutter control data set to open array shutter elements corresponding to conductive links to be removed.

BRIEF DESCRIPTION OF DRAWINGS

The novel features believed characteristic of the present invention are set forth in the appended claims. The present invention itself however, as well as a preferred mode of use, further objects and advantages thereof, will best be understood by reference to the following detailed description of an illustrative embodiment(s) when read in conjunction with the accompanying drawings, wherein:

FIGS. 3A through 3C are partial cross-sectional views through a first conductive link structure illustrating how the link can be broken according an alternative technique of the present invention;

FIG. 4A through 4C are partial cross-sectional views through a second conductive link structure illustrating how the link can be broken according an alternative technique of the present invention;

FIG. 5A is a plan view of a semiconductor die showing the position of conductive link banks according to the present invention;

FIGS. 5B and 5C are progressively higher magnification plan views of portions of the conductive link banks of FIG. 5A according to the present invention;

FIG. 5D is a dimensioned plan view of a single conductive link according to the present invention;

FIG. 6 is a plan view of a shutter array according to the present invention;

DETAILED DESCRIPTION OF THE INVENTION

Since laser fuses are actually nothing more than conductive links (and the term conductive link will be used from this point forward), often comprised of metals or semiconducting materials, they could be "blow" by photolithographic means. That is, the wafer, for example, could be coated with photoresist, the resist patterned in a manner to remove the photoresist from over the conductive links to be removed. However the problem of creating a unique exposure pattern has been a limitation of this technique.

Figure 13:
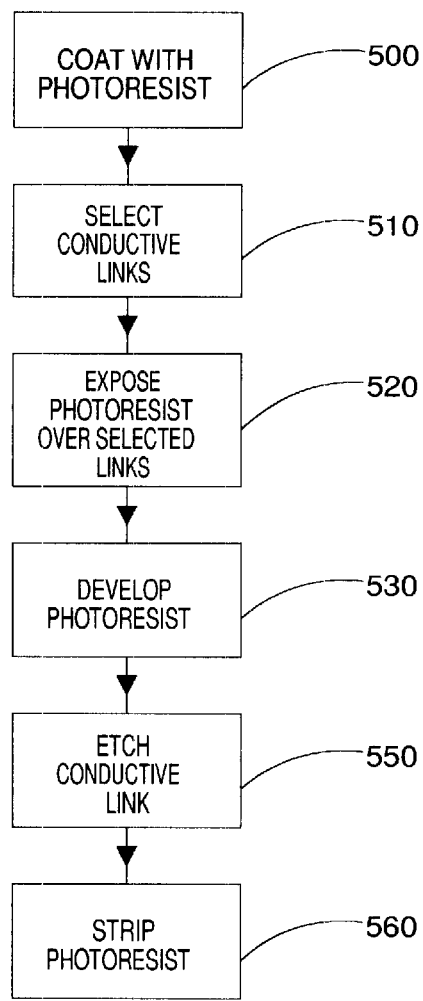
FIG. 13 is a flowchart of a first embodiment of the method of removal of conductive links according to the present invention.
Figure 14:
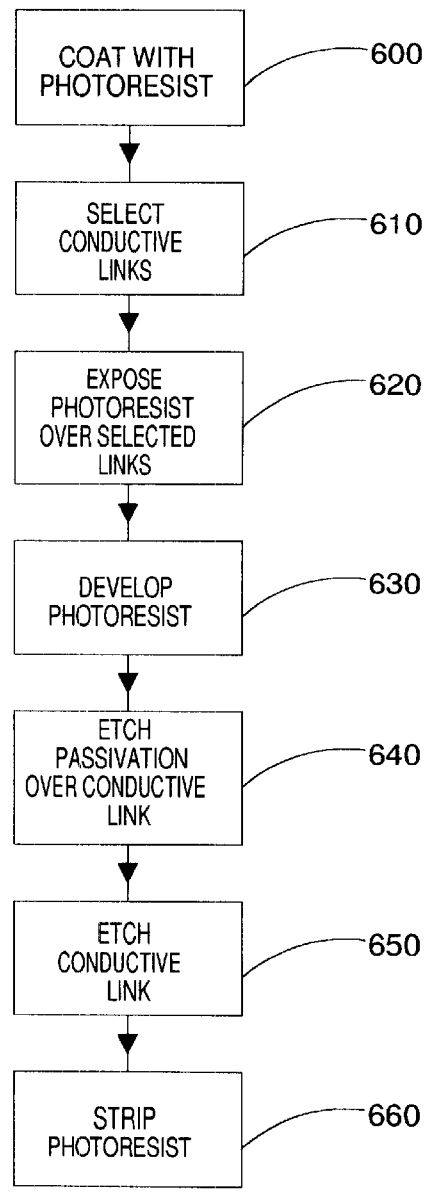
FIG. 14 is a flowchart of a second embodiment of the method of removal of conductive links according to the present invention.

Two methods of removal of conductive links according to the present invention are illustrated in FIGS. 13 and 14. FIG. 13 is a flowchart of a first embodiment of the method of removal of conductive links according to the present invention. In step 500, the device, die, or wafer is coated with photoresist. In step 510 the conductive links to be removed are selected. In step 520, the photoresist over the selected conductive links is exposed. In step 530, the photoresist coating is developed to expose the selected conductive links, while the non-selected conductive links are protected by the photoresist coating. In step 550 the selected conductive links are removed by etching, either wet or dry. In step 560 the photoresist coating is removed.

FIG. 14 is a flowchart of a second embodiment of the method of removal of conductive links according to the present invention. This embodiment differs from the first embodiment just described in that the conductive links are protected by a passivation layer. This passivating layer must be removed before the conductive link can be etched. In step 600, the device, die, or wafer is coated with photoresist. In step 610 the conductive links to be removed are selected. In step 620, the photoresist over the selected conductive links is exposed. In step 630, the photoresist coating is developed to expose the selected conductive links and the passivating layer, while the non-selected conductive links and passivation layer are protected by the photoresist coating. In step 640 the exposed passivation layer over the selected conductive links is removed by etching, either wet or dry. In step 650 the selected conductive links are removed by etching, either wet or dry. In step 660 the photoresist coating is removed. It is possible to remove the photoresist before etch the selected conductive links or the before etch of the selected conductive links depending upon passivation layer and conductive links materials and the etch chemistries as the passivation layer can act as a protective layer for the non-selected conductive links.

Four preferred embodiments of the conductive link structure according to the present invention as illustrated in FIGS. 1 through 4, will be first presented. In all cases the present invention will be described using positive working photoresist.

Figure 1A:
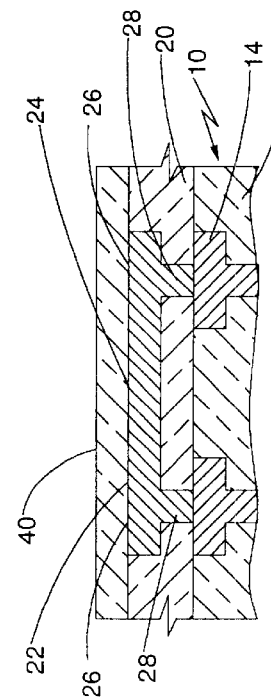
FIGS. 1A through 1C are partial cross-sectional views through a first conductive link structure illustrating how the link can be broken according to the present invention.
Figure 1B:
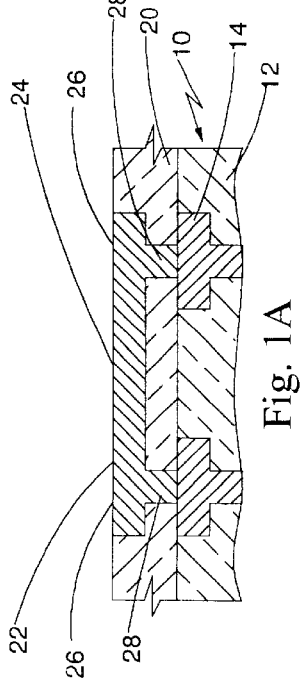
Figure 1C:
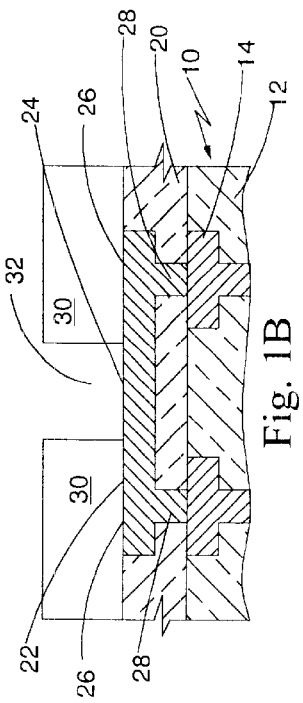

FIGS. 1A through 1C are partial cross-sectional views through a first conductive link structure illustrating how the link can be broken according to the present teachings of the invention. In FIG. 1A, a substrate 10 has a lower level dielectric 12 having lower level interconnect metallurgy 14 therein. On top of lower dielectric layer 12 is upper dielectric layer 22. Upper level dielectric layer 20 contains conductive link 22. Conductive link 22 has a center portion 24 and end portions 26. End portions 26 are connected to vias 28 allowing electrical contact to lower level interconnect metallurgy 14. Lower level interconnect metallurgy 14 connects to a sense circuit that can: 1) sense the presence or absence of conductive link 22 and; 2) program the circuits or device to be programmed accordingly. Conductive link 22 can be comprised polysilicon, copper, aluminum, tungsten, tantalum, tantalum nitride, titanium, or titanium nitride which are materials that are conductors or semiconductors. Vias 28 can be comprised of polysilicon, copper, aluminum, tungsten, tantalum, tantalum nitride, titanium, titanium nitride which are materials that are conductors or semiconductors. Conductive link 22 and vias 28 can be integrally formed and therefore comprised of the same material. Lower dielectric layer 12 and upper dielectric layer 20 can be comprised of conventional dielectric materials such as silicon oxide or silicon nitride, or low dielectric constant materials such as porous silicon dioxide or a nanofoam material.

In FIG. 1B, photoresist layer 30 has been exposed and developed forming pattern 32 to expose center portion 24 of conductive link 22.

In FIG. 1C, center portion 24 of conductive link 22 has been etched away and the photoresist stripped, breaking the electrical continuity to the sense circuit. Suitable etching techniques include reactive ion plasma etching, chemical downstream etching, sputter plasma etching, and wet chemical etching which are well known in the art. The etch chemistry would be chosen to match the metallurgy of conductive link 22. For example, if conductive link 22 were comprised of copper, a dilute ferric chloride wet etch would be suitable, if conductive link 22 were comprised of tungsten, a dilute hydrogen peroxide/ammonium hydroxide solution would be a suitable etchant.

Figure 2A:
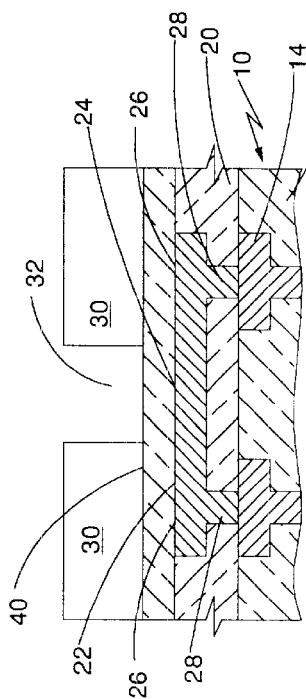
FIGS. 2A through 2C are partial cross-sectional views through a second conductive link structure illustrating how the link can be broken according to the present invention.
Figure 2B:
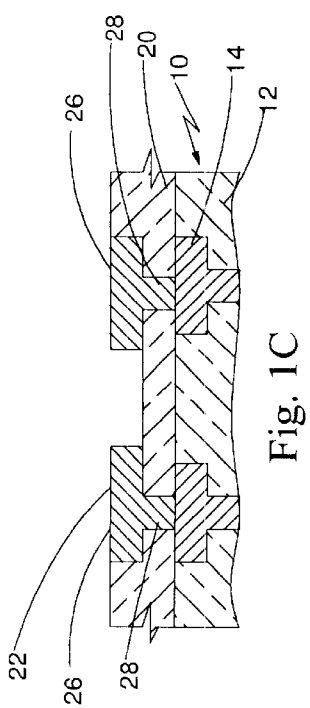
Figure 2C:
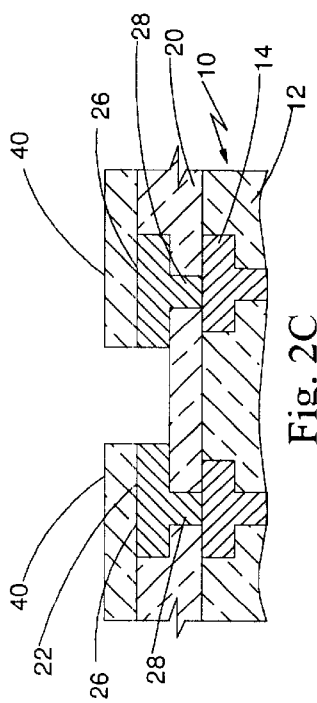

FIGS. 2A through 2C are partial cross-sectional views through a second conductive link structure illustrating how the link can be broken according to the present invention. In FIG. 2A, a substrate 10 has a lower level dielectric 12 having lower level interconnect metallurgy 14 therein. On top of lower dielectric layer 12 is upper dielectric 20. Upper level dielectric layer 20 contains conductive link 22. Conductive link 22 has a center portion 24 and end portions 26. End portions 26 are connected to vias 28 allowing electrical contact to lower level interconnect metallurgy 14. Lower level interconnect metallurgy 14 connects to a sense circuit that can: 1) sense the presence or absence of conductive link 22; and 2) program the circuits or device to be programmed accordingly. On top of upper dielectric layer 20 and conductive link 22 is passivation layer 40. Passivation layer 40 can be comprised of single or multiple layers. Such layers include, but are not limited to, silicon nitride, silicon oxide, and polyimide. Conductive link 22 can be comprised of polysilicon, copper, aluminum, tungsten, tantalum, tantalum nitride, titanium, or titanium nitride which are materials that are conductors or semiconductors. Vias 28 can be comprised of polysilicon, copper, aluminum, tungsten, tantalum, tantalum nitride, titanium, or titanium nitride which are materials that are conductors or semiconductors. Conductive link 22 and vias 28 can be integrally formed and therefore comprised of the same material. Lower dielectric layer 12 and upper dielectric layer 20 can be comprised of conventional dielectric materials such as silicon oxide or silicon nitride, or low dielectric constant materials such as porous silicon dioxide or a nanofoam material.

In FIG. 2B, photoresist layer 30 has been exposed and developed forming pattern 32 to expose passivation layer 40 over center portion 24 of conductive link 22.

In FIG. 2C, the portion of passivation layer 40 over center portion 24 of conductive link 22 and center portion 24 of conductive link 22 have been etched away and the photoresist stripped, breaking the electrical continuity to the sense circuit. Suitable etching techniques include reactive ion plasma etching, chemical downstream etching, sputter plasma etching, and wet chemical etching which are well known in the art. The particular etch chemistry used is chosen to match the metallurgy of conductive link 22 and the passivation. For example, if conductive link 22 were comprised of copper, a dilute ferric chloride wet etch would be suitable. In a further example, if conductive link 22 were comprised of tungsten, a dilute hydrogen peroxide/ ammonium hydroxide solution would be a suitable etchant. If the passivation were silicon oxide, a chlorine based plasma chemistry could be used. The chemistries used to etch the conductive link and the passivation should be chosen to be compatible.

FIGS. 3A through 3C are partial cross-sectional views through a first conductive link structure illustrating how the link can be broken according to an alternative embodiment of the present invention.

In FIG. 3A, a substrate 10 has a lower level dielectric 12 having lower level interconnect metallurgy 14 therein. On top of lower dielectric layer 12 is upper dielectric 20. Upper level dielectric layer 20 contains conductive link 22. Conductive link 22 has a center portion 24 and end portions 26. End portions 26 are connected to vias 28 allowing electrical contact to lower level interconnect metallurgy 14. Lower level interconnect metallurgy 14 connects to a sense circuit that can: 1) sense the presence or absence of conductive link 22; and 2) program the circuits or device to be programmed accordingly. On top of upper dielectric layer 20 and conductive link 22 is passivation layer 40. Passivation layer 40 can be comprised of single or multiple layers. Such layers include, but are not limited to, silicon nitride, silicon oxide, and polyimide. Conductive link 22 can be comprised of polysilicon, copper, aluminum, tungsten, tantalum, tantalum nitride, titanium, or titanium nitride which are materials that are conductors or semiconductors. Vias 28 can be comprised of polysilicon, copper, aluminum, tungsten, tantalum, tantalum nitride, titanium, or titanium nitride which are materials that are conductors or semiconductors. Conductive link 22 and vias 28 can be integrally formed and therefore comprised of the same material. Lower dielectric layer 12 and upper dielectric layer 20 can be comprised of conventional dielectric materials such as silicon oxide or silicon nitride, or low dielectric constant materials such as porous silicon dioxide or a nanofoam material.

In FIG. 3B, photoresist layer 30 has been exposed and developed forming pattern 32 to expose the entire length of conductive link 22. 20 In FIG. 3C, the entire length of conductive link 22 has been etched away and the photoresist stripped, breaking the electrical continuity to the sense circuit. A portion of vias 28 can be left in place. In fact this can be desirable as a corrosion stop as in the case where conductive link 22 and lower interlevel connect metallurgy 14 are comprised of copper, vias 28 can be comprised of tungsten. Suitable etching techniques include reactive ion plasma etching, chemical downstream etching, sputter plasma etching, and wet chemical etching which are well known in the art. The particular etch chemistry used is chosen to match the metallurgy of conductive link 22 and the passivation. For example, if conductive link 22 were comprised of copper, a dilute ferric chloride wet etch would be suitable. In a further example, if conductive link 22 were comprised of tungsten, a dilute hydrogen peroxide/ ammonium hydroxide solution would be a suitable etchant.

FIGS. 4A through 4C are partial cross-sectional views through a second conductive link structure illustrating how the link can be broken according to an alternative embodiment of the present invention. In FIG. 4A, a substrate 10 has a lower level dielectric 12 having lower level interconnect metallurgy 14 therein. On top of lower dielectric layer 12 is upper dielectric 20. Upper level dielectric layer 20 contains conductive link 22. Conductive link 22 has a center portion 24 and end portions 26. End portions 26 are connected to vias 28 allowing electrical contact to lower level interconnect metallurgy 14. Lower level interconnect metallurgy 14 connects to a sense circuit that can: 1) sense the presence or absence of conductive link 22; and 2) program the circuits or device to be programmed accordingly. On top of upper dielectric layer 20 and conductive link 22 is passivation layer 40. Passivation layer 40 can be comprised of single or multiple layers. Such layers include, but are not limited to, silicon nitride, silicon oxide, and polyimide. Conductive link 22 can be comprised of polysilicon, copper, aluminum, tungsten, tantalum, tantalum nitride, titanium, or titanium nitride which are materials that are conductors or semiconductors. Vias 28 can be comprised of polysilicon, copper, aluminum, tungsten, tantalum, tantalum nitride, titanium, or titanium nitride which are materials that are conductors or semiconductors. Conductive link 22 and vias 28 can be integrally formed and therefore comprised of the same material. Lower dielectric layer 12 and upper dielectric layer 20 can be comprised of conventional dielectric materials such as silicon oxide or silicon nitride, or low dielectric constant materials such as porous silicon dioxide or a nanofoam material.

In FIG. 4B, photoresist layer 30 has been exposed and developed forming pattern 32 to expose passivation layer 40 over center portion 24 of conductive link 22.

In FIG. 4C, the portion of passivation layer 40 over entire conductive link 22 and entire conductive link 22 have been etched away and the photoresist stripped, breaking the electrical continuity to the sense circuit. As illustrated in FIG. 4C, a portion of vias 28 can be left in place. In fact this can be desirable as a corrosion stop as in the case where conductive link 22 and lower interlevel connect metallurgy 14 are comprised of copper, vias 28 can be comprised of tungsten. Suitable etching techniques include reactive ion plasma etching, chemical downstream etching, sputter plasma etching, and wet chemical etching which are well known in the art. The particular etch chemistry used is chosen to match the metallurgy of conductive link 22 and the passivation. For example, if conductive link 22 were comprised of copper, a dilute ferric chloride wet etch would be suitable. In a further example, if conductive link 22 were comprised of tungsten, a dilute hydrogen peroxide/ammonium hydroxide solution would be a suitable etchant. If the passivation were silicon oxide, a chlorine based plasma chemistry could be used. The chemistries used to etch the conductive link and the passivation should be chosen to be compatible.

Turning to the method of exposing conductive links selectivity when a plurality of conductive links exist, FIG. 5A is a plan view of semiconductor die 50 having conductive link banks 52 disposed thereupon (e.g. or ASIC dies). In accordance FIG. 5B is a blow-up of a portion of conductive link banks 50 showing individual fuses 22. These fuses can be similar to FIGS. 1A, 2A, 3A, and 4A or variations thereof. FIG. 5C is a blow-up of a portion two fuses 22 shown in FIG. 5B. Each fuse 22 can be seen to be comprised of center portion 24 and end portions 26. Vias 28 can or can not be integral to conductive link 22. FIG. 5D illustrates and example of dimensions that may be expected in modern conductive link structures. The length of center portion 24 is in the range of 2 to 5 microns, with a width of 0.5 to 1 micron.

An exposure system for exposing the previously described embodiments must be capable of only exposing all or portions of selected conductive links (i.e. no exposure on undesirable areas). A preferred embodiment of such an exposure system is broadly illustrated and explained in connection with FIG. 6.

FIG. 6 is a plan view of a shutter array 70 having individually operable micro-shutters 72 constructed in accordance with a preferred embodiment of the present invention. In the present case, a whole die shutter array is shown. The individual shutters are shown much larger than they would normally be for explanation purposes.

An example of how the shutter array 70 can be used in a specific application is explained below. Assuming shutter array 70 is to be used in a full field 10×reduction exposure system to expose only where only center portions 24 of 1 by 5 micron conductive links are to be removed, the individually operable micro-shutters 72 would need to be 20 by 40 micron in size. In a scanning exposure system, a 20×reduction is possible, so individually operable micro-shutters 72 could be 40 by 80 microns in size. In use, only those micro-shutters aligned over those conductive links to be removed are opened, thus allowing exposure of the photoresist only over those conductive links to be removed.

Figure 7:
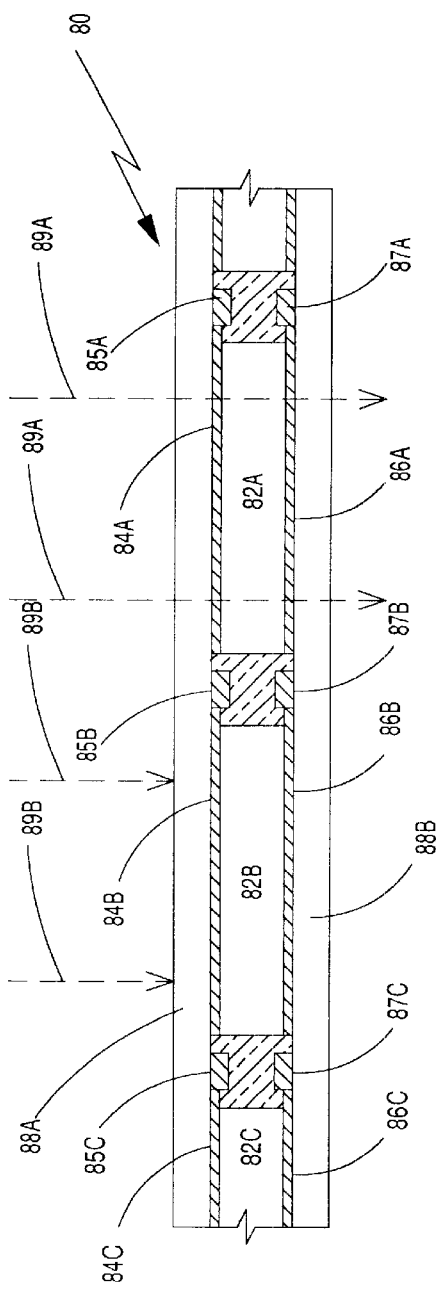
FIG. 7 is a cross-sectional view through a portion of a liquid crystal shutter array according to the present invention.

FIG. 7 is a cross-sectional view through a portion of a liquid crystal shutter array constructed in accordance with the present invention. Liquid crystal shutters work by passing or blocking light of particular polarization angles. Liquid crystal array shutter 80 includes cells 82A, through 82C each of which are filled with liquid crystal in such a manner as to orient polarized light at a first angle. Above each cell 82A through 82C are upper electrode plates 84A through 84C respectively, to which a voltage can be applied by signal lines 85A through 85C respectively. Below each cell 82A through 82C are upper electrode plates 86A through 86C respectively, to which a voltage can be applied by buses 87A through 87C respectively. By application of the proper relative voltage any of bus combinations 85A/87B through 85C/87C, the alignment of the liquid crystal in cells 82A through 82C, respectively, can be changed so as to orient polarized light at second angle, 90° to the first angle. Upper plate 88A and lower plate 88B are polarizer's to ensure the incoming light and exiting light are of only one rotation. The no power rotation of the liquid crystal in the cells is chosen to block transmission of light 89B when no power is applied to the cell and pass light 89A when power is applied to the cell. Since the images being exposed are relatively large by modern micro-lithographic standards, ultra violet light in the G-line or 405 to 415 nanometer range would be suitable. Thus, the liquid crystal material must be chosen to be chemically stable when exposed to light of these wavelengths.

Figure 8:
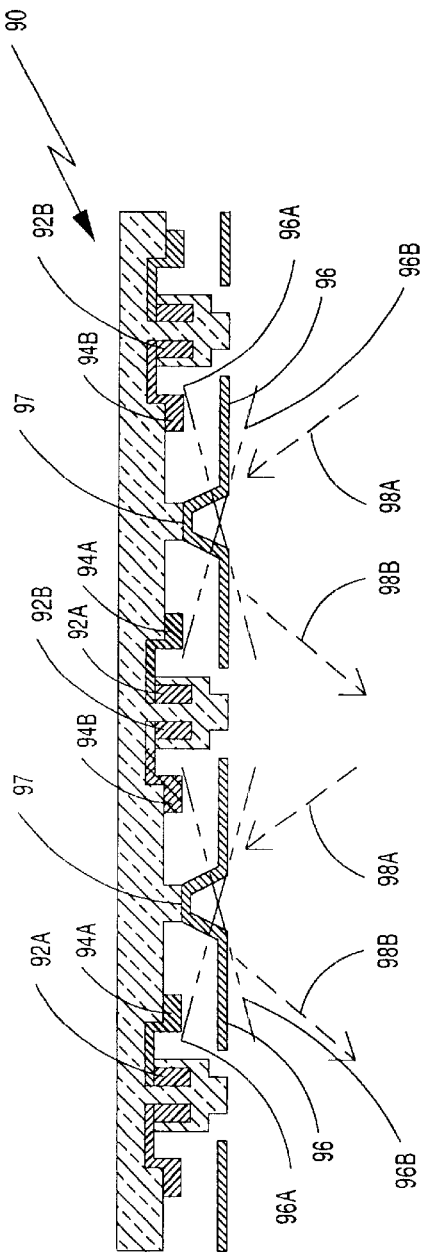
FIG. 8 is a cross-sectional view through a portion of a micro-mirror shutter array according to the present invention.

FIG. 8 is a cross-sectional view through a portion of a micro-mirror shutter array. Micro mirror shutters work by deflecting light into or away from a critical path. Micro-mirror shutter array 90 comprise a plurality of micro-mirrors 96 arranged on support posts 97. Arranged on either side of micro-mirrors 96 are deflection electrodes 94A and 94B to which voltage can be applied through signal lines 92A and 92B respectively. With voltage applied to micro mirror 96 in combination with a repelling voltage on signal line 92A micro-mirror 96 will tilt to the plane defined by 96A. With voltage applied to micro mirror 96 in combination with a repelling voltage on signal line 92B micro-mirror 96 will tilt to the plane defined by 96B. Therefore incoming light beam 98A can be deflected to outgoing beam 98B by more the incidence angle.

Figure 9:
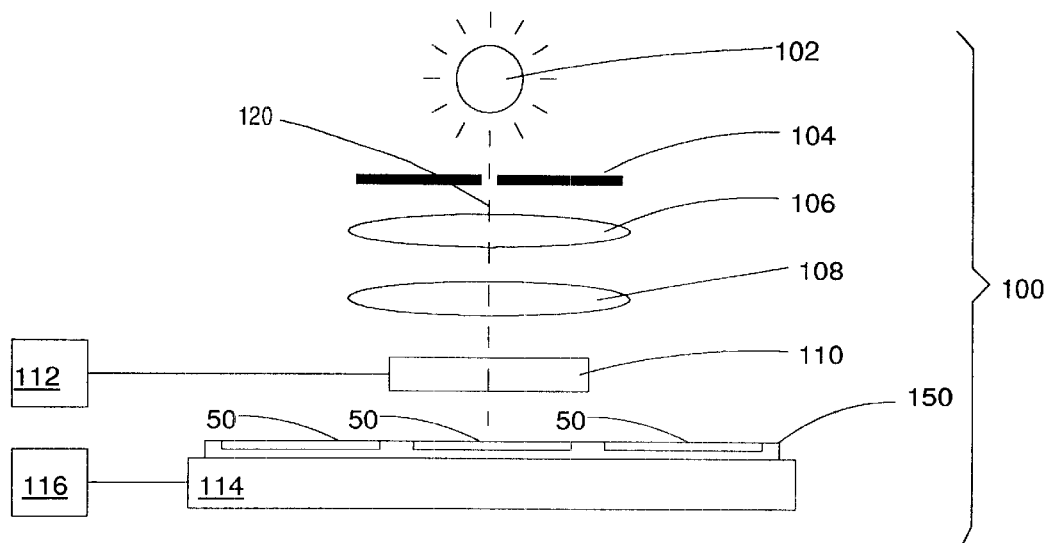
FIG. 9 is a stylized schematic illustration of a full field exposure tool having a full die sized liquid crystal array shutter according to the present invention.

In order for the array shutter to be useful it;must be fitted into a suitable photolithographic system. Three possible systems will now be described. FIG. 9 is a stylized schematic illustration of a full field exposure tool utilizing a full die sized liquid crystal array shutter according to the present invention. In FIG. 9 light from light source 102 passes through slit 104, condensing lens 106 and focusing lens 108 before impinging upon liquid crystal array shutter 110. Shutter controller 112 determines whether the cells are transmissive. Wafer stage 114, under the control of wafer controller 116, moves wafer 150 to align conductive links 22 on dies 50 to liquid crystal array shutter 110. In response to a pre-selected pattern, shutter controller 112 will open individual micro-shutters of liquid crystal array shutter 110 to expose the resist only over the conductive links to be removed. Line 120 defines the main optical axis of the system. The pre-selected pattern, can of course be different for each die.

Figure 10:
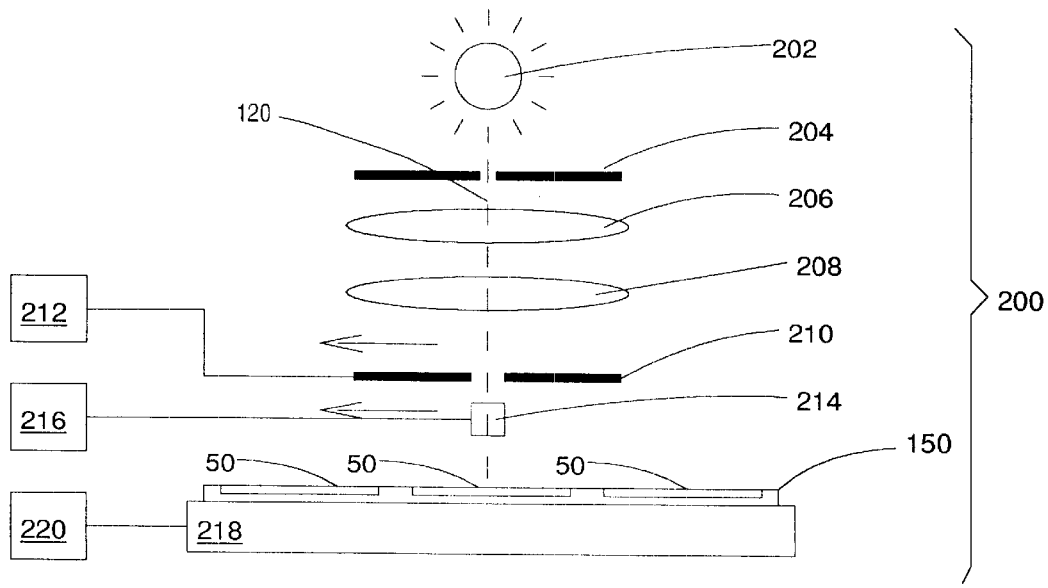
FIG. 10 is a stylized schematic illustration of a scanning field exposure tool having a slit sized liquid crystal array shutter according to the present invention.

FIG. 10 is a stylized schematic illustration of a scanning field exposure tool using a slit sized liquid crystal array shutter in accordance with the present invention. In FIG. 10 light from light source 202 passes through slit 204, condensing lens 206 and focusing lens 208 and moving scan slit 210, the movement of which is under control of slit controller 212, before impinging upon liquid crystal array shutter 214 which is not a full die sized array, but only as wide as the slit in one direction, and die length in the other direction. Which cells are transmissive and which are not is directed by shutter controller 216. Wafer stage 218 under the control of wafer controller 220 moves wafer 150 to align conductive links 22 on dies 50 to liquid crystal array shutter 214 in an initial position and then moves in synchronization with the movement of scan slit 210. In response to a pre-selected pattern, shutter controller 216 will open individual micro-shutters of liquid crystal array shutter 214 to expose the resist only over the conductive links to be removed as they pass below liquid crystal array shutter 214 during the scan. Line 120 defines the main optical axis of the system. The pre-selected pattern, can of course be different for each die.

Figure 11:
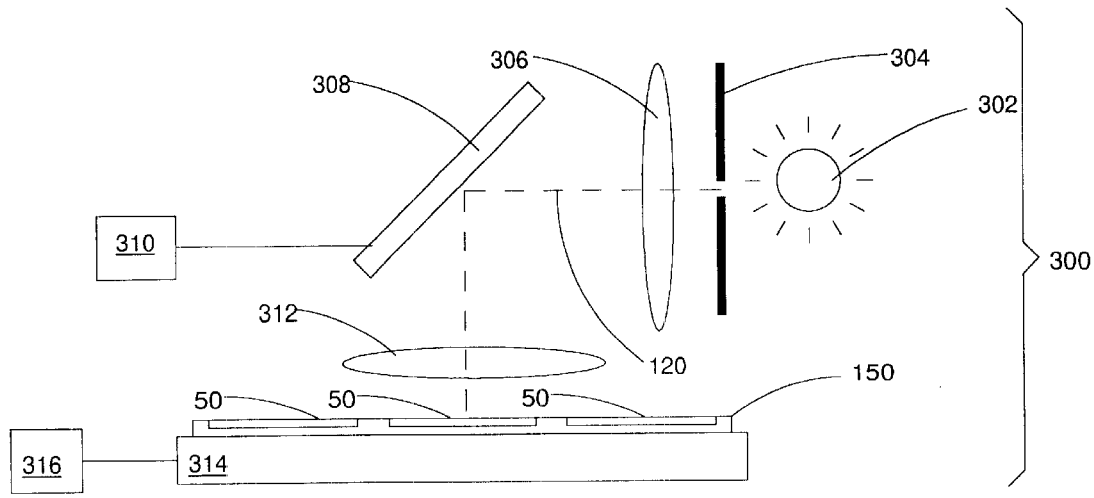
FIG. 11 is a stylized schematic illustration of a full field exposure tool having a full die sized micro-mirror array shutter according to the present invention.

FIG. 11 is a stylized schematic illustration of a full field exposure tool having a full die sized micro-mirror array shutter. In FIG. 11 light from light source 302 passes through slit 304, and condensing lens 306 before impinging upon micro-mirror array shutter 308. Which mirrors deflect light through focusing lens 312 is directed by shutter controller 310. Wafer stage 314 under the control of wafer controller 316 moves wafer 150 to align conductive links 22 on dies 50 to micro-mirror shutter 314. In response to a pre-selected pattern, shutter controller 310 will deflect individual micro-mirrors of micro-mirror array shutter 308 to expose the resist only over the conductive links to be removed. Line 120 defines the main optical axis of the system. The pre-selected pattern, can of course be different for each die.

It is possible to construct a scanning micro-mirror array exposure system, which would work very similarly to the scanning liquid crystal array shutter system described above.

Depending upon the reason for removal of conductive links, the data to drive the shutter controllers and stage controllers can be created in different ways. If the conductive links are used in an electronic wafer serial number or die serial number control scheme, a simple data set can be constructed using a small computer and appropriate software. The same is true if certain dies or devices are to have certain function activated or deactivated. If however, the device is to be used to correct device or die performance based on test data, the situation is more complicated. This would be the case for redundant cell replacement on DRAMs, SRAM's, or certain embedded arrays on ASIC's, to name two examples. This situation will now be discussed.

Figure 12:
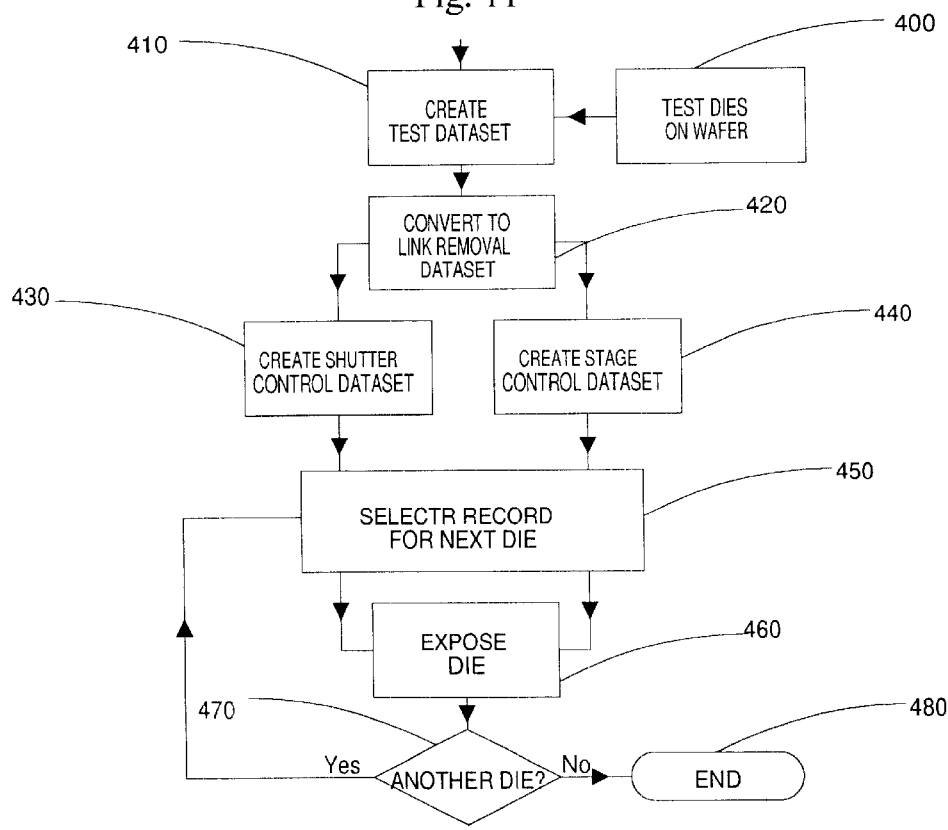
FIG. 12 illustrates major system components for a system for programming a semiconductor device according to the present invention, including data flow, according to the present invention.

FIG. 12 illustrates a flow chart for a system for programming a semiconductor device when the programming data is generated from test data, including data flow in accordance with the present invention. The example of a wafer of dies is used. In Step 400, each die on a wafer is tested and a test data set is created in step 410. This data set indicates what dies are failing, their coordinates on the wafer, and how to "repair" them by removing conductive links, if possible. In step:420 the test data set is converted to a link removal data set which gives the physical location of conductive links to be removed by die. The link removal data set is used to create a shutter control data set in step 430, which is in reality the pattern of individual shutters in the case of a liquid crystal array shutter system, or the pattern of individual mirrors to deflect in the case of a stage control shutter control data set in step 440 for moving from die to die.

In the case of a scanning system, portions of the stage control data set is used to move the scanning slit as well. In step 450 the data for an individual die is selected. In step 460, the individual die is exposed. In step 470, a check is done to see of any dies to be programmed remain. If yes, the loop back to step 450 is chosen, if not the operation is terminated in step 480.

The description of the embodiments of the present invention is provided above for the understanding of the present invention. It will be understood that the present invention is not to be limited to the particular embodiments described herein, but is capable of various modifications, rearrangements and substitutions.

Therefore it is intended that the following claims cover all such modifications and changes as fall within the true spirit and scope of the present invention.

What is claimed is:

1. A method of programming a semiconductor device, the method comprising the steps of:

creating an array of fuses for enabling or disabling functionality of the semiconductor device depending on whether the fuse is removed or intact;

forming a layer of photoresist over each one of the fuses;

removing the photoresist from a predetermined set of the fuses; and removing the predetermined set of fuses.

2. The method of claim 1 wherein the step of removing the predetermined set of fuses includes the step of:

etching the predetermined set of fuses.

3. The method of claim 2 wherein the step of removing the photoresist from a predetermined set of the fuses includes the steps of:

exposing the photoresist from a predetermined set of the fuses; and developing the exposed photoresist.

4. A method of programming a semiconductor device having a plurality of fuses for enabling or disabling functionality of the semiconductor device, the method comprising the steps of:

forming a layer of photoresist over each one of the fuses;

removing the photoresist from a predetermined set of the fuses; and removing the predetermined set of fuses, thereby changing the functionality of the semiconductor device.

5. The method of claim 4 wherein the step of removing the predetermined set of fuses includes the step of:

etching the predetermined set of fuses.

6. The method of claim 5 wherein the step of removing the photoresist from a predetermined set of the fuses includes the steps of:

exposing the photoresist from a predetermined set of the fuses; and developing the exposed photoresist.

* * * * *